United States Patent [19]

Akyuerek et al.

[11] 4,041,602
[45] Aug. 16, 1977

[54] METHOD OF PRODUCING SEMICONDUCTOR COMPONENTS AND STRIP FOR CARRYING OUT THE METHOD

[75] Inventors: Altan Akyuerek, Heppenheim; Eckhard Meyer, Lampertheim, both of Germany

[73] Assignee: BBC Brown, Boveri & Company, Limited, Baden, Switzerland

[21] Appl. No.: 665,763

[22] Filed: Mar. 11, 1976

[30] Foreign Application Priority Data

Mar. 14, 1975 Germany .............................. 2511209

[51] Int. Cl.² .............................................. B01J 17/00
[52] U.S. Cl. ...................................... 29/588; 29/590; 29/591; 29/576 S
[58] Field of Search ...................... 29/576 S, 588, 589, 29/590, 591

[56] References Cited

U.S. PATENT DOCUMENTS

| | | | |
|---|---|---|---|
| 3,497,947 | 3/1970 | Ardezzone | 29/576 S |
| 3,553,828 | 1/1971 | Starger | 29/576 S |
| 3,698,073 | 10/1972 | Helda | 29/588 |

*Primary Examiner*—W. Tupman
*Attorney, Agent, or Firm*—Oblon, Fisher, Spivak, McClelland & Maier

[57] ABSTRACT

A method is disclosed for producing semiconductor components by contacting the electrodes of disk-shaped semiconductor chips with at least one pn-junction by means of a comb with contact legs. The method includes bending a strip coated with solder on at least one side into a number of identical sections each having a wing-like profile viewed normal to the length of the strip, laying the side of the winged strip opposite the wings on the top main surfaces of the semiconductor chips and pre-attaching it to them. The method further includes aligning a cooling-fin comb and/or leg comb in a soldering jig, introducing the winged strip with the pre-attached semiconductor chips, soldering the resultant comb system which is held together by pressure on the winged strip, cutting apart the conducting links between the semiconductor electrodes formed by the winged strip, lacquering, baking and encapsulating in plastic the comb system except for the ends of the electrode leads formed by the contact legs.

7 Claims, 9 Drawing Figures

METHOD OF PRODUCING SEMICONDUCTOR COMPONENTS AND STRIP FOR CARRYING OUT THE METHOD

BACKGROUND OF THE INVENTION

1. Field of the Invention:

The invention is concerned with a method for producing semiconductor components involving contacting the electrodes of diskshaped semiconductor chips with at least one pn-junction by means of a comb with contact legs. The method is suitable for the mass-production of semiconductor components. The invention is further concerned with a strip for carrying out the method.

2. Description of the Prior Art:

In a known method of this sort, the contacting of the semiconductor electrodes by the contact legs or teeth of the comb is indirect, i.e. connecting wires from the semiconductor electrodes to the teeth are soldered to the teeth and fastened, besides, to the part of the comb holding the teeth, so that, when the strip is removed, all left-over wire ends causing short circuits are removed (DT-AS 1,514,870). The comb possesses teeth of differing widths, the wider teeth, for example, being provided for contacting the collector zone of a transistor. The comb can serve as a metal strip for contacting several semiconductor components.

The method described is suitable for contacting smaller components. Larger ones, like power thyristors or triacs, have a heat sink at a main electrode, e.g. the anode. Besides the contacting, there is also the attachment to the heat sink to be considered.

SUMMARY OF THE INVENTION

The aim of the invention, starting from the aforementioned method as a base, is to improve the mounting technique in the fabrication of semiconductor components with respect to production time and effort. In spite of the simplified production method, the semiconductor component is to have good electrical and mechanical properties.

The foregoing and other objects are attained in accordance with one aspect of the present invention through the provision of bending a strip, tinned on at least one side with solder, into a number of identical sections in such a way that they have a wing-like profile viewed normal to the length of the strip, applying the side of the winged strip opposite the wings to the one main surface of the semiconductor chips and pre-attaching them there, aligning a cooling-fin comb and/or the leg comb in a soldering jig and then laying on this the winged strip with the pre-attached semiconductor chips, soldering the comb system secured by the pressure of the strip and breaking the conducting connection between the semiconductor electrodes formed by the winged strip, lacquering and baking the comb system and embedding it in plastic except for part of the electrode leads formed by the contact legs.

The lifting of a single semiconductor chip by means of a wire previously thermofixed to it has been described (Dt-OS 2,314,195). To reduce the work of alignment of the semiconductor elements for contacting, a disk is divided into a number of chips by cutting it along two sets of straight lines at right angles to one another. The chips are held in their original configuration on an electrostatically charged plastic film. In this position individual wires are attached to them. They are lifted up by the wires and finally fastened to and contacted by a support with conducting paths or a conductor comb using the free ends of the wires. The attachments of the wires can be by thermocompression. The first attachment to the semiconductor chips saves alignment effort because the exact position of the contact point is known. In the lifting of the individual chip, transporting it and depositing it on the supporting element, however, difficult and precise guidance of the tool, e.g. the tweezers used, is required.

In contrast, the method of the invention, in a surprisingly advantageous manner, makes use of a strip in the form of a series of winged sections to which semiconductor chips are pre-attached at predetermined distances apart and by means of which they can be simultaneously placed in the soldering jig. The wing-shaped profile simplifies alignment with the cooling-fin comb and/or leg comb. Here, the cooling-fin comb can conveniently lie in a lower plane and the leg comb in an upper plane determined by the thickness of the semiconductor chips and the height of the wings.

It is advantageous to pre-attach the semiconductor chips by thermocompression to the winged strip on one side and to a pedestal on the other side. The use of a pedestal as such follows an earlier proposal (patent application P 24 00 863.7) and ensures that the pn-junction emerging at the edge of the semiconductor chip is at a safe distance from conducting material, e.g. solder on the cooling-fin comb. When the pedestal is used, the leg comb naturally is higher, by the pedestal thickness, above the cooling-fin comb than described above.

The method of the invention, which can be called the wing system for short, has the further advantage that the cooling-fin comb can be put in the soldering jig first. The leg comb is aligned with the cooling-fin comb axially and transversely. The winged strip with the pre-attached semiconductor chips is simply laid on top, so that the contact legs are transverse to the wings. The backs of the cooling-fin comb and leg comb are situated on the two sides of the winged strip which makes the alignment process and gripping them for adjustment easier.

As an alternative to the process step just described, the procedure can be such that a cooling-fin comb integral with the leg comb is placed in the soldering jig, the comb having both cooling fins and contact legs suitably aligned and shaped to be connected with the pedestals and wings. Such a one-comb design corresponds to an earlier proposal in patent application P 24 60346.1. In it, the contact legs, in a preliminary forming process, are shifted over the cooling fins with an intervening space left for receiving the semiconductor chip. In the present instance, the winged strip with the mounted semiconductor chips is inserted into this intervening space.

The invention has the additional problem of providing a suitable strip for carrying out the method. The solution to this problem is to have a strip of good thermally and electrically conducting material coated on at least one side with solder and with constricted sections at regular intervals. In conformity with the lateral electrode configurations on the semiconductor chips, naturally only certain regions should be contacted, and, as explained above, the conducting paths between the semiconductor-chip electrodes formed by the winged strip must again be broken. For this purpose, the constricted sections are conveniently bent to form bridge-like portions which arch over the regions not to be contacted. Because of their narrowness, they can later be easily broken.

Further the ready-for-assembly strip is bent into wing-shaped sections on both sides of the bridge-containing sections for contacting the semiconductor chips. The wing shape, as explained above, simplifies the connection to the contact legs of the leg comb.

BRIEF DESCRIPTION OF THE DRAWINGS

Various objects, features and attendant advantages of the present invention will be more fully appreciated as the same becomes better understood from the following detailed description of the present invention when considered in connection with the accompanying drawings. Following the process sequence there is shown in.

DETAILED DESCRIPTION OF A PREFERRED EMBODIMENT

The method of the invention, called the "wing system", will be described below in connection with the fabrication of thyristors. However, it is not limited to the production of these semiconductor components.

Figure 1:
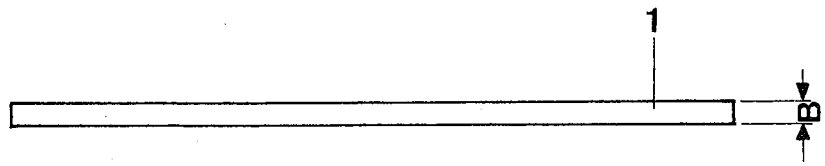
FIG. 1 a strip coated with solder on one side,
FIG. 2 the stamped strip,
FIG. 3 the strip with bridge-shaped bends in it,
FIG. 4 the winged strip with mounted semiconductor chips,
FIG. 5 an element separated from the winged strip,
FIG. 6 the winged strip with semiconductor chips, leg comb and cooling-fin comb in a soldering jig,
FIG. 7 schematically a fixation of the comb system consisting of winged strip, leg comb and cooling-fin comb for soldering,
FIG. 8 the removal of the bridges between the contact legs and
FIG. 9 a finished semiconductor component before lacquering, baking and encapsulation.
Figure 2:
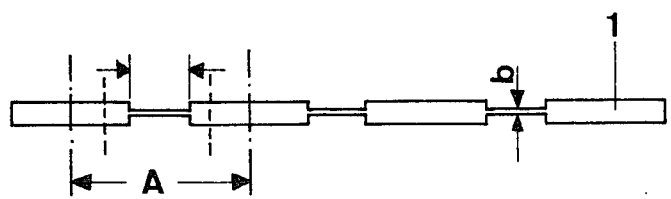

Referring now to the drawings, wherein like reference numerals designate identical or corresponding parts throughout the several views, and more particularly to FIG. 1 thereof, a strip 1 of preselected width B and thickness is coated with solder on one side. It consists of a good thermally and electrically conducting material, preferably copper, and in regularly repeating intervals A has sections a of narrower width b (FIG. 2). The strip is formed in this way by stamping.

Figure 3:
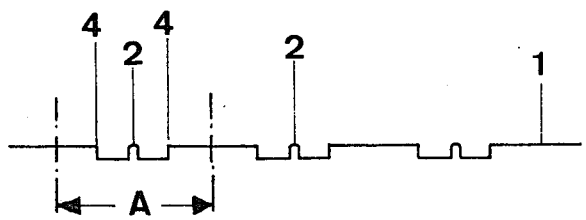

FIG. 3 shows the strip 1 rotated about its long axis from its orientation in FIG. 2 to give a side view. The sections a of narrower width b are bent so as to have bridge-shaped portions.

Figure 4:
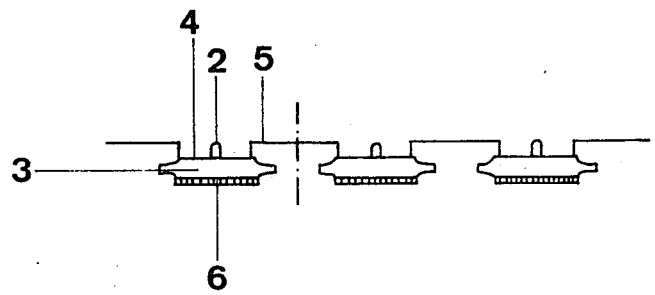

On both sides of the looped bridges 2 and the portions 4 for contacting the semiconductor chips 3, the strip 1 is bent so as to be wing-shaped. The wings are indicated by the number 5 (FIG. 4).

The strip 1 is laid on top of the semiconductor chips or wafers. The wings 5 then form the gate and cathode connections to the one main surface of the semiconductor chip 3. The other main surface or anode side is provided with a pedestal 6. Strip 1, semiconductor chip 3 and pedestal 6 are pre-attached by thermocompression.

Figure 5:
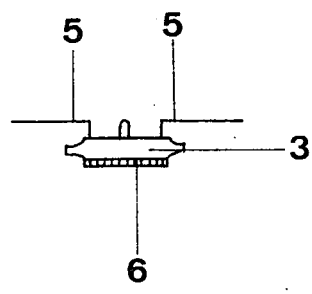

FIG. 5 shows an element separated from the winged strip and possessing a cathode lead, a gate and an anode and thus, if necessary, it can be connected separately to the corresponding contact elements of a leg or cooling-fin comb, in order to form a hybrid circuit, for example.

Figure 6:
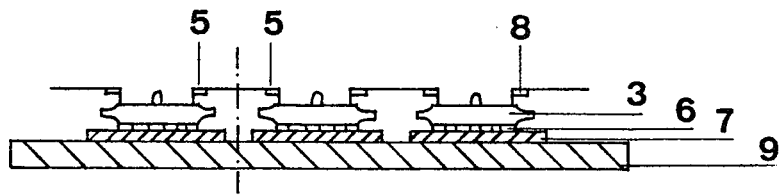
Figure 7:
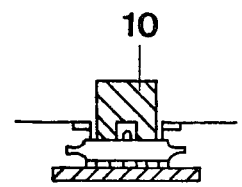

Preferably, however, the winged strip with the mounted semiconductor chips 3 is laid in a soldering jig 9 after introduction and alignment of a cooling-fin comb 7 and/or a leg comb 8 and the strip is then aligned with and clamped to the contact legs and cooling fins (FIG. 6 and FIG. 7).

The comb system thus produced is held in the clamped position for soldering by appropriate loading, schematically shown in FIG. 7 as a weight 10. The comb system with mounted semiconductor chips is soldered in a continuous-heating oven under a hydrogen atmosphere.

Figure 8:
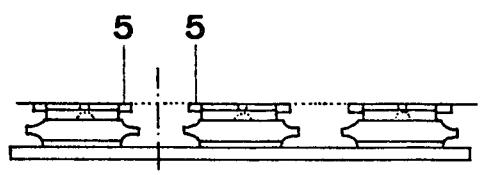

After the soldering process, the conduction paths formed by the strip 1, i.e. the bridges 2 and the connecting wings 5, are cut in the middle. This can be done with a mechanical device. If the bridges 2 are made thin, they can simply be pulled off (FIG. 8).

Figure 9:
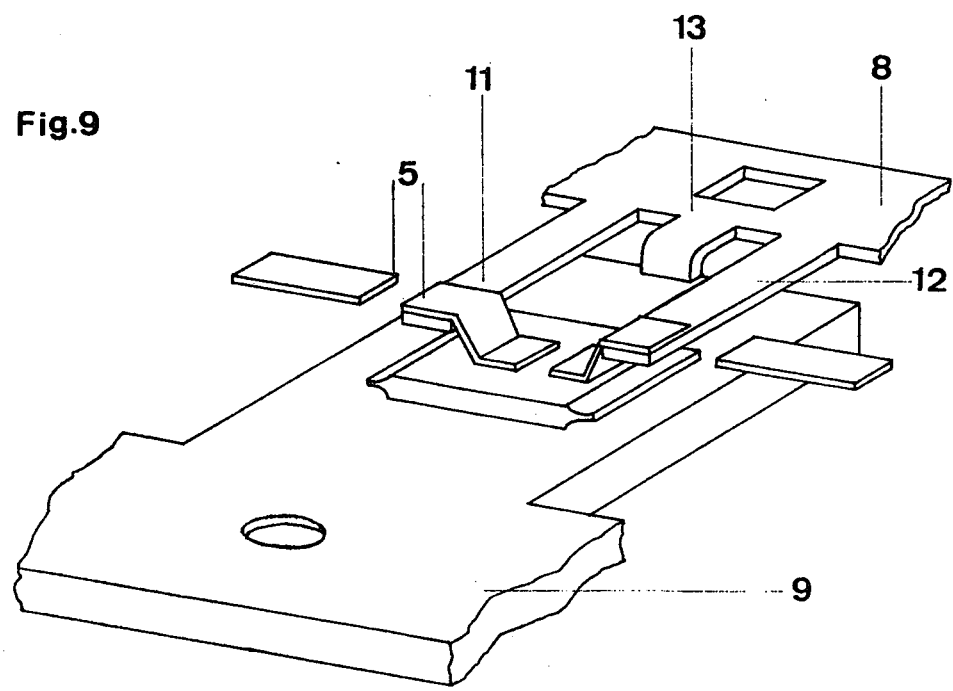

Next, the comb system, a single element of which is shown in plan view in FIG. 9, is lacquered, baked and encapsulated in plastic in a self-evident manner.

FIG. 9 shows further that the remaining portion of the wing 5 together with a contact leg 11 can form the gate lead, another wing portion together with a contact leg 12 can form the cathode lead and a contact leg 13 connected to the cooling-fin comb 7, the anode lead. The back of the leg comb 8 is sectioned afterwards by cutting along the dotted lines 14. The cutting line is effected in parallel to the contact projections in order to save metal.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by letters patent of the United States is:

1. A process for the production of semiconductor devices by contacting the electrodes of disk-like semiconductor bodies having at least one p-n junction with a first prefabricated metal strip in the form of a comb whose comb projections are designated as contact projections, and comprising the steps of:
   providing a second metal strip coated with solder at least on one side as an intermediate connection between the semiconductor bodies and the contact projections of the first metal strip;
   uniformly bending the second metal strip into a number of identical sections each having a wing-like profile viewed normal to the length of the second metal strip;
   next placing the side of the second metal strip which is opposite the wings onto the top main surfaces of the semiconductor bodies;
   pre-attaching the semiconductor bodies to the second metal strip;
   providing the first metal strip designated for connection with the wings and by means of these with the electrodes on the top main surfaces of the semiconductor bodies;
   providing a third metal strip, in the form of a comb with cooling fins, designated for contacting the bottom main surfaces of the semiconductor bodies;
   aligning the contact projections of the first metal strip and the cooling fins of the third metal strip;
   then introducing the second metal strip with the pre-attached semiconductor bodies between the first and second metal strips so that its length runs normal to the direction of alignment of the contact projections of the first metal strip and the cooling fins of the third metal strip;

holding together the comb system thus formed by the three metal strips and the semiconductor bodies;

soldering the comb system while pressing down the second metal strip;

severing the second metal strip between the electrodes on the semiconductor bodies to disconnect the conducting links formed thereby;

lacquering the comb system;

baking the comb system;

surrounding the comb system with plastic except for part of the contact projections; and dividing the comb system into individual constructional units.

2. A process according to claim 1, wherein the pre-attaching step comprises pre-attaching by thermal compression the top main surfaces of the semiconductor bodies to the second metal strip; and including the step of inserting a pedestal between the semiconductor bodies and the third metal strip.

3. A process according to claim 1 including the steps of:

connecting the first metal strip and the third metal strip with each other before the soldering step; and sectioning the first metal strip whereby the connection between the first and the third metal strip is released.

4. A process according to claim 1 wherein the soldering step includes:

soldering the comb system in a continuous heating furnace under a hydrogen atmosphere while pressing down the second metal strip.

5. A process according to claim 1 comprising the use of:

a thermally and electrically conducting material of a preselected width coated at least on one side with solder and having sections of a narrower width at regularly repeating intervals.

6. A process according to claim 5, wherein: the sections of a narrower width are bent out forming bridges.

7. A process according to claim 6, wherein:

the conducting material is bent out forming wings spaced from either side of the bridges by parts provided for contacting semiconductor bodies.

* * * * *